United States Patent
Udagawa (10) Patent No.: US 6,984,851 B2
(45) Date of Patent: Jan. 10, 2006

(54) GROUP-III NITRIDE SEMICONDUCTOR LIGHT-EMITTING DIODE, LIGHT-EMITTING DIODE LAMP, LIGHT SOURCE, ELECTRODE FOR GROUP-III NITRIDE SEMICONDUCTOR LIGHT-EMITTING DIODE, AND METHOD FOR PRODUCING THE ELECTRODE

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/881,782

(22) Filed: Jun. 18, 2001

(65) Prior Publication Data

US 2002/0000563 A1    Jan. 3, 2002

Related U.S. Application Data

(60) Provisional application No. 60/248,011, filed on Nov. 14, 2000.

(30) Foreign Application Priority Data

Jun. 21, 2000  (JP)  ............................ P2000-185554
Apr. 16, 2001  (JP)  ............................ P2001-116251

(51) Int. Cl.
   *H01L 29/22*    (2006.01)

(52) U.S. Cl. .............................. 257/99; 257/94; 438/46

(58) Field of Classification Search ................ 438/604, 438/606, 605, 46, 47; 257/615, 94, 96, 98, 257/99, 103
See application file for complete search history.

(56) References Cited

U.S. PATENT DOCUMENTS

| | | | | |
|---|---|---|---|---|
| 4,232,440 A | * | 11/1980 | Bastek | 257/99 |
| 5,076,860 A | * | 12/1991 | Ohba et al. | 117/89 |
| 5,528,071 A | * | 6/1996 | Russell et al. | 257/414 |
| 5,760,423 A | * | 6/1998 | Kamakura et al. | 257/81 |
| 5,789,768 A | * | 8/1998 | Lee et al. | 257/96 |
| 5,977,566 A | | 11/1999 | Okazaki et al. | 257/99 |
| 6,078,064 A | * | 6/2000 | Ming-Jiunn et al. | 257/101 |
| 6,512,248 B1 | * | 1/2003 | Takeuchi et al. | 257/81 |

FOREIGN PATENT DOCUMENTS

| | | | |
|---|---|---|---|
| JP | 57-111076 | | 7/1982 |
| JP | 05129658 A | * | 5/1993 |
| JP | 2000-058451 | | 5/2000 |
| JP | 2001142051 A | * | 5/2001 |

* cited by examiner

*Primary Examiner*—Tom Thomas
*Assistant Examiner*—N. Drew Richards
(74) *Attorney, Agent, or Firm*—Sughrue Mion, PLLC (57) ABSTRACT

The present invention solves the problem of conventional group-III nitride semiconductor LED in that, since the LED driving current is supplied only from a pad electrode serving also as an ohmic electrode, the driving current cannot diffuse over a wide range of the light-emitting region and a group-III nitride semiconductor LED having high light emission intensity cannot be successfully provided. A group-III nitride semiconductor LED having high light emission intensity, which is fabricated using a stacked layer structure obtained by providing a surface ohmic electrode, a window layer including an electrically conducting transparent oxide crystal layer and a pad electrode on an electrically conducting substrate through a boron phosphide (BP)-based buffer layer to allow the driving current to diffuse over a wide range of the light-emitting region is provided.

20 Claims, 6 Drawing Sheets

Fig. 1

PRIOR ART

Fig. 2

PRIOR ART

GROUP-III NITRIDE SEMICONDUCTOR LIGHT-EMITTING DIODE, LIGHT-EMITTING DIODE LAMP, LIGHT SOURCE, ELECTRODE FOR GROUP-III NITRIDE SEMICONDUCTOR LIGHT-EMITTING DIODE, AND METHOD FOR PRODUCING THE ELECTRODE

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/248,011 filed Nov. 14, 2000 pursuant to 35 U.S.C. §111(b).

FIELD OF THE INVENTION

The present invention relates to a group-III nitride semiconductor light-emitting diode (LED) having a configuration of ohmic electrodes suitable for diffusing a driving current of a device over a wide range of a light-emitting region, an electrode for use in the group-III nitride semiconductor light-emitting diode and a method for producing the electrode.

BACKGROUND OF THE INVENTION

A group-III nitride semiconductor light-emitting diode is fabricated by providing an electrode on a stacked layer structure having a pn-junction type light-emitting part comprising, for example, aluminum gallium indium nitride ($Al_X Ga_Y In_{1-X-Y}N$, where $0 \leq X$, $Y \leq 1$ and $0 \leq X+Y \leq 1$). In the stacked layer structure, a buffer layer is generally provided for relaxing lattice mismatch between the substrate material and the group-III nitride semiconductor layer constituting the stacked layer structure, thereby growing a high-quality group-III nitride semiconductor layer (see, JP-A-2-229476 (the term "JP-A" as used herein means an "unexamined published Japanese patent application")). In the stacked layer structure for use in a light-emitting device using a sapphire ($\alpha$-$Al_2O_3$ single crystal) substrate, the buffer layer is exclusively composed of aluminum gallium nitride (compositional formula; $Al_\alpha Ga_\beta N$, where $0 \leq \alpha, \beta \leq 1$) (see, JP-A-2-229476 supra).

When a stacked layer structure uses an insulating material such as sapphire for the substrate, an electrode, namely, an ohmic electrode for supplying a device driving current to LED, comprising such a stacked layer structure is disposed on p-type and n-type conductive layers constituting the stacked layer structure (see, JP-A-6-260682).

Figure 1:
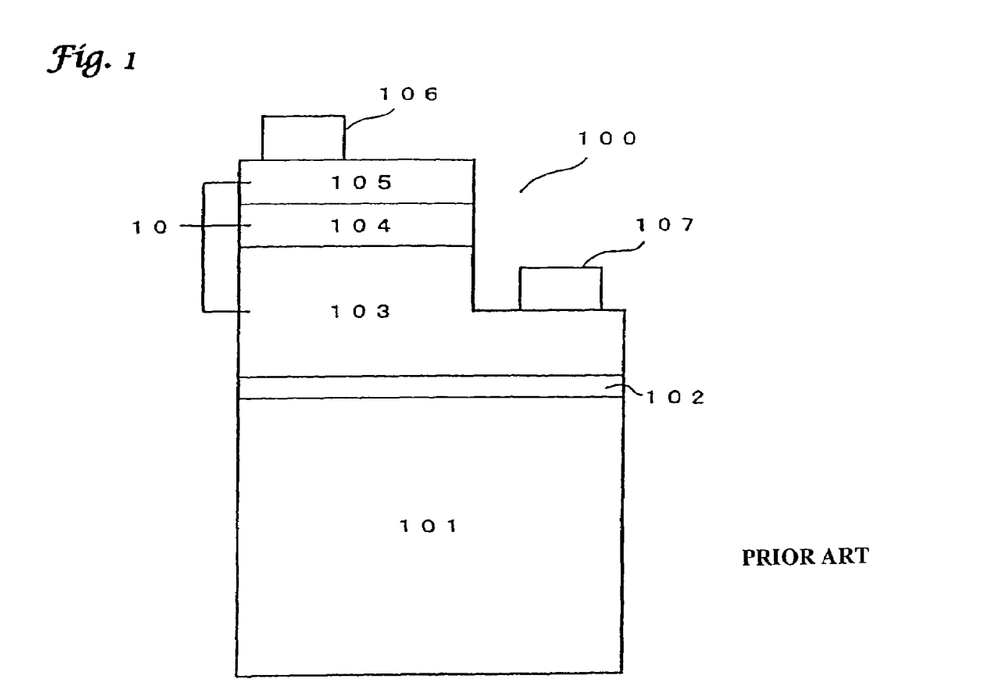
FIG. 1 is a schematic sectional view of a conventional group-III nitride semiconductor LED.

FIG. 1 is a view schematically showing the cross-sectional structure of a conventional group-III nitride semiconductor LED 100 having a light-emitting part 10 of a pn-junction type double hetero (DH) structure comprising a sapphire substrate 101 having provided thereon, via an $Al_\alpha Ga_\beta N$ (where $0 \leq \alpha, \beta \leq 1$ and $\alpha+\beta=1$) buffer layer 102, a lower clad layer 103 composed of an n-type gallium nitride (GaN), a light-emitting layer 104 composed of gallium indium nitride ($Ga_Y In_{1-Y}N$, where $0 \leq Y \leq 1$), and an upper clad layer 105 composed of p-type GaN. The substrate 101 is insulating and therefore, p-type and n-type ohmic electrodes 106 and 107 must be provided on the surfaces of the p-type conductive layer (p-type clad layer 105) and the n-type conductive layer (n-type clad layer 103), respectively, constituting the stacked layer structure. The electrode 107 is formed through a cumbersome processing of cutting a part of the light-emitting part 10, and since a part of the light-emitting part 10 is removed, the surface area of the light-emitting part 10 disadvantageously decreases. As a result, a group-III nitride semiconductor LED ensuring high light emission intensity cannot be provided.

In another conventional example, a stacked layer structure for use in a group-III nitride semiconductor blue LED is constructed using an electrically conducting crystal, such as gallium phosphide (GaP) or silicon, for the substrate (see, JP-A-2-275682). Also, a technique of forming a buffer layer from a boron phosphide (BP)-based material when constructing this stacked layer structure is disclosed (see, JP-A-2-275682 supra). In the case of a stacked layer structure using an electrically conducting crystal substrate, it is common to provide an electrode having a first conduction form corresponding to the conduction form of the substrate crystal on the back surface of the substrate and to dispose an electrode having a second conduction form opposed thereto on a stacked layer structure-constituting layer having conduction form opposite the substrate crystal (see, JP-A-10-247761). In this conventional example of an electrode configuration, the light-emitting part provided on the substrate surface does not need to be eliminated. Accordingly, the surface area of the light-emitting part is not reduced, which by itself is advantageous in obtaining a high intensity group-III nitride semiconductor LED.

Figure 2:
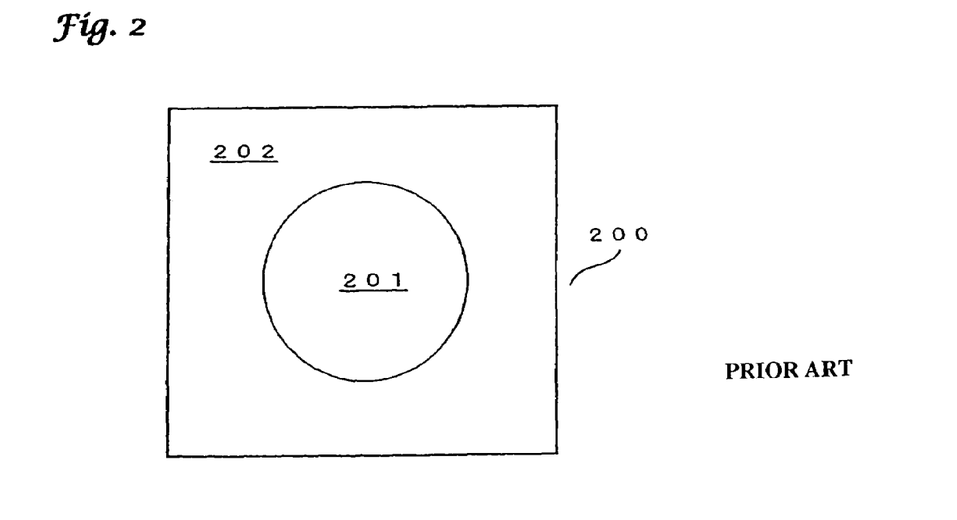
FIG. 2 is a schematic plan view of a conventional group-III nitride semiconductor LED.

FIG. 2 is a view schematically showing an example of the planarly structure of a conventional group-III nitride semiconductor LED 200 having a first conduction-type ohmic electrode (back-surface ohmic electrode) on the back surface of an electrically conducting substrate, and a second conduction-type ohmic electrode (surface ohmic electrode) on the surface of the stacked layer structure. The surface ohmic electrode 201 usually also serves as an electrode for wire-bonding (pad electrode) and is disposed only in the center part of one constituent layer 202 of the stacked layer structure (see, JP-A2-275682). In still another conventional example, a surface ohmic electrode is attached with a band-shaped electrode directly contacting the pad electrode in the center part (see, JP-A-11-168240).

The surface ohmic electrode has been heretofore mainly provided on an aluminum gallium nitride ($Al_X Ga_Y N$, where $0 \leq X, Y \leq 1$ and $X+Y=1$) crystal layer (see, JP-A-6-314822). However, aluminum nitride (AlN) and gallium nitride (GaN) are greatly small in mobility compared with other group III–V compound semiconductors such as gallium arsenide (GaAs) and indium phosphide (InP) (see, Yasuharu Suematsu, *Hikari Device (Photo-Device)*, 1st ed., 8th imp., pp. 28–29, Corona Sya (May 15, 1997)). For example, the hole mobility of aluminum nitride (AlN) at room temperature is 14 $cm^2$/V.s, which is as low as about 1/30 in comparison, for example, with 500 $cm^2$/V.s of an indirect transition-type boron phosphide (BP), (see, *Photo-Device* supra, pp. 28–29). Accordingly, by using a conventional electrode configuration means for providing an ohmic electrode only on a constituent layer, the device operating current cannot be satisfactorily diffused over a wide range of a light-emitting part, which is disadvantageous in obtaining a high-intensity group-III nitride semiconductor LED.

With respect to the current diffusivity, by taking into account the fact that the physical properties of the group-III nitride semiconductor are inferior to other group III–V compound semiconductors, a conventional technique discloses a means of using, a transparent metal thin film electrode as an ohmic electrode, directly connected to a pad electrode (see, JP-A-6-314822). For example, a transparent ohmic electrode composed of a gold (Au) thin film is provided almost over the entire surface of a gallium nitride (GaN)-related group-III nitride semiconductor layer which is doped with p-type impurity (see, JP-A-6-314822 supra). However, in this conventional technique, much of the light emitted from the light-emitting part is absorbed by the metal thin film constituting the electrode, and as a result, the light emission which can be displayed outside the LED is disadvantageously reduced in the intensity.

An indium tin composite oxide (ITO) film has a high transmittance to blue light, green light or longer wavelength light emitted from a group-III nitride semiconductor LED compared with the above-described metal thin film (see, *Tomei Doden Maku no Gijutsu* (*Transparent Conductive Film Technology*), 1st ed., 1st imp., pp. 97–101, Ohmu Sya (Mar. 30, 1999)). For more efficiently displaying the emitted light to the outside by utilizing this transmittance, a technique of constructing a group-III nitride semiconductor LED so that an electrically conducting transparent oxide crystal layer comprising ITO is provided as a contact layer (a window layer for transmitting the emitted light) of the gallium nitride (GaN) layer is known (see, (1) JP-A-49-122294, (2) JP-U-A-6-38265 (the term "JP-U-A" as used herein means an "unexamined published Japanese utility model application) and (3) *Appl. Phys. Lett.*, Vol. 74, No. 26, pp. 3930–3932 (1999)).

In many conventional techniques, an electrically conducting transparent oxide crystal layer, such as ITO, is disposed particularly on a p-type GaN layer which is poor in current diffusivity due to difficulties in obtaining high hole concentration and high mobility (see, JP-U-A-6-38265 and *Appl. Phys. Lett.*, supra). However, the ITO cannot exhibit good ohmic contact with the group-III nitride semiconductor crystal layer, and in the above-described case, the forward voltage (Vf) disadvantageously elevates (see, for more detail, *Appl. Phys. Lett.*, supra, Vol. 74 (1999)).

SUMMARY OF THE INVENTION

The present invention has been achieved by taking into account those problems in conventional techniques, and proposes a means of disposing ohmic electrodes for a group-III nitride semiconductor LED having an electrically conducting transparent crystal layer, such as ITO, as a window layer for efficiently displaying the emitted light to the outside, which can allow the device operating current to diffuse over a wide range of a light-emitting part and high-intensity light emission to be displayed. Accordingly, an object of the present invention is to provide a high intensity group-III nitride semiconductor light-emitting diode having an ohmic electrode disposed by the above-described means. Another object of the present invention includes providing an electrode for the group-III nitride semiconductor light-emitting diode and a method for producing the electrode.

The present invention is particularly characterized in that a surface ohmic electrode is disposed, with respect to the position of a pad electrode, at a suitable position on the surface of one constituent layer of a stacked layer structure to diffuse a device operating current over a wide range of a light-emitting part.

The present invention provides the following embodiments:

(1) a group-III nitride semiconductor light-emitting diode comprising at least a first conduction-type single crystal substrate provided with a first conduction-type back-surface ohmic electrode on the back surface thereof, a buffer layer composed of a boron phosphide (BP)-based material and formed on the surface of the single crystal substrate, a gallium nitride (GaN)-based group-III nitride crystal layer containing a light-emitting part of hetero-junction structure and provided on the buffer layer, and a window layer composed of an electrically conducting transparent oxide crystal layer and provided on the group-III nitride crystal layer, wherein a second conduction-type surface ohmic electrode conductive with the window layer is formed between the surface of the group-III nitride crystal layer and the window layer to come into contact with the surface of the group-III nitride crystal layer and a pad electrode for wire bonding is formed in the center on the upper surface of the window layer.

(2) the group-III nitride semiconductor light-emitting diode as described in (1), wherein the surface ohmic electrode is disposed in the periphery of the pad electrode, (3) the group-III nitride semiconductor light-emitting diode as described in (1) or (2), wherein the surface ohmic electrode is disposed at the bilaterally symmetric position with respect to the center of the pad electrode, (4) the group-III nitride semiconductor light-emitting diode as described in (1) to (3), wherein the surface ohmic electrodes are disposed at isometric positions from the center of the pad electrode, (5) the group-III nitride semiconductor light-emitting diode as described in (1) to (4), wherein the surface ohmic electrode is composed of a plurality of electrodes disposed at equal intervals, (6) the group-III nitride semiconductor light-emitting diode as described in (1) to (5), wherein the surface ohmic electrode is disposed in the region (hereinafter referred to as an "open light-emitting region") other than the projective region of the pad electrode on the surface of the group-III nitride crystal layer, (7) the group-III nitride semiconductor light-emitting diode as described in (6), wherein the sum of areas of the surface ohmic electrodes is from 5 to 30% of the total area of the open light-emitting region, and (8) the group-III nitride semiconductor light-emitting diode as described in (1) to (7), wherein the group-III nitride crystal layer in contact with the surface ohmic electrode comprises gallium phosphide nitride ($GaN_{1-X}P_X$; $0<X<1$).

(9) a light-emitting diode lamp using the group-III nitride semiconductor light-emitting diode described in (1) to (8), and (10) a light source using the light-emitting diode lamp described in (9).

(11) an electrode for group-III nitride semiconductor light-emitting diodes, which is used for a group-III nitride semiconductor light-emitting diode comprising at least a gallium nitride (GaN)-based group-III nitride crystal layer containing a light-emitting part of hetero-junction structure, and a window layer comprising an electrically conducting transparent oxide crystal layer provided on the group-III nitride crystal layer, wherein a surface ohmic electrode conductive with the window layer is formed between the surface of the group-III nitride crystal layer and the window layer to come into contact with the surface of the group-III nitride crystal layer and a pad electrode for wire bonding is formed in the center on the upper surface of the window layer.

(12) the electrode for group-III nitride semiconductor light-emitting diodes as described in (11), wherein the surface ohmic electrode is disposed at a position in the periphery of the pad electrode, (13) the electrode for group-III nitride semiconductor light-emitting diodes as described in (11) or (12), wherein the surface ohmic electrode is disposed at the bilaterally symmetric position with respect to the center of the pad electrode, (14) the electrode for group-III nitride semiconductor light-emitting diodes as described in (11) to (13), wherein the surface ohmic electrodes are disposed at isometric positions from the center of the pad electrode, (15) the electrode for group-III nitride semiconductor light-emitting diodes as described in (11) to (14), wherein the surface ohmic electrode is composed of a plurality of electrodes disposed at equal intervals, (16) the electrode for group-III nitride semiconductor light-emitting diodes as described in (11) to (15), wherein the surface ohmic electrode is disposed in the region (hereinafter referred to as an "open light-emitting region") other than the projective region of the pad electrode on the surface of the group-III nitride crystal layer, (17) the electrode for group-III nitride semiconductor light-emitting diodes as described in (16), wherein the sum of areas of the surface ohmic electrodes is from 5 to 30% of the total area of the open light-emitting region, and (18) the electrode for group-III nitride semiconductor light-emitting diodes as described in (11) to (17), wherein the group-III nitride crystal layer in contact with the surface ohmic electrode comprises gallium phosphide nitride ($GaN_{1-X}P_X$, where $0<X<1$).

(19) a method for producing an electrode for group-III nitride semiconductor light-emitting diodes, comprising a first step of forming a surface ohmic electrode to come into contact with the surface of a gallium nitride (GaN)-based group-III nitride crystal layer containing a light-emitting part of hetero-junction structure, a second step of, subsequently to the first step, covering the surface of the group-III nitride crystal layer and the surface ohmic electrode to form a window layer comprising an electrically conducting transparent oxide crystal layer conductive with the surface ohmic electrode, and a third step of, subsequently to the second step, forming a pad electrode for wire bonding in the center on the upper surface of the window layer to be conductive with the window layer, and (20) the method for producing an electrode for group-III nitride semiconductor light-emitting diodes as described in (19), wherein the pad electrode is formed on the group-III nitride crystal layer through a window layer comprising an electrically conducting transparent oxide crystal layer such that the electrically conducting transparent oxide crystal layer is not present on the surface used for wire bonding of the pad electrode.

DESCRIPTION OF THE PRESENT INVENTION

Figure 3:
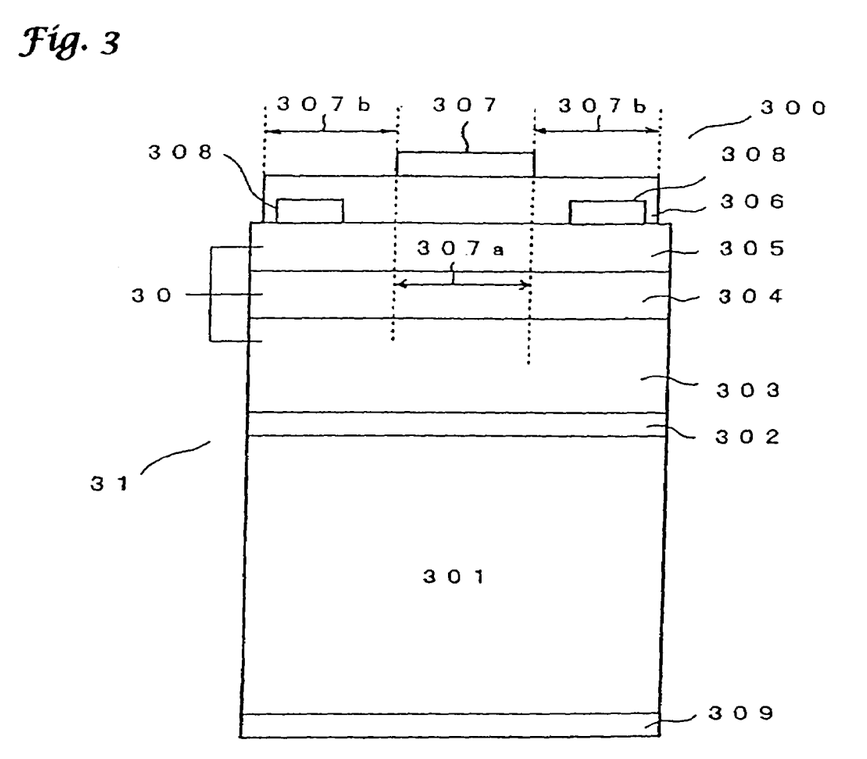
FIG. 3 is a schematic sectional view of a group-III nitride semiconductor LED having a surface ohmic electrode according to the present invention.

FIG. 3 is a schematic sectional view for explaining the group-III nitride semiconductor LED 300 and an electrode construction thereof according to a first embodiment of the invention described in (1) or (11) above. In the LED 300 according to the first embodiment, the matrix material is a stacked layer structure 31 where a single crystal having electric conductivity is used as the substrate 301. By using this electrically conducting single crystal as the substrate, a first conduction-type ohmic electrode can be provided on the back surface of the substrate, as the back-surface ohmic electrode 309. More specifically, unlike conventional group-III nitride LEDs using a substrate of electrically insulating single crystal, such as sapphire, the ohmic electrode is provided without involving any partial removal of a light-emitting part. Therefore, the light-emitting part is not reduced in surface area, which is advantageous in obtaining a group-III nitride LED having high light emission intensity. Furthermore, when a single crystal having electric conductivity and also having cleavage property is used as the substrate, separation into individual devices can be readily and simply performed utilizing the cleavage of the crystal, whereby fabrication of a group-III nitride LED can be extremely facilitated. Examples of the single crystal having both electric conductivity and cleavage property, which can be suitably used as the substrate, include silicon (Si), gallium phosphide (GaP) and gallium arsenide (GaAs). From the standpoint that a group-III nitride semiconductor layer is generally stacked on the surface of a substrate at a deposition temperature as high as in excess of about 800° C., silicon single crystal (silicon) and the like having heat resistance at high temperatures are suitably used as the substrate. For example, a p-type or n-type silicon having a plane azimuth of {100} or {111} is suitable as the substrate.

On the surface of the substrate 301 comprising an electrically conducting crystal, a buffer layer 302 composed of a boron phosphide (BP)-based material is provided. The boron phosphide (BP)-based material means a group III–V compound semiconductor containing at least boron (B) and phosphorus (P) as constituent elements. Examples of the BP-based material include boron nitride phosphide ($BN_{1-X}P_X$, where $0<X<1$) and boron gallium phosphide ($B_{1-Y}Ga_YP$, where $0<Y<1$), in addition to boron phosphide (BP). The BP-based material is reduced in the lattice mismatch with a group-III nitride semiconductor constituting the pn-junction type double hetero (DH) junction light-emitting part 30, such as gallium nitride (GaN). For example, $BN_{0.03}P_{0.97}$ (lattice constant: 4.510 Å) having a nitrogen compositional ratio (=1−X) of 0.03 (3%) is advantageous in that a buffer layer capable of lattice-matching with cubic crystal GaN can be formed therefrom. By virtue of this good lattice matching, the buffer layer comprising a BP-based material exerts an effect of giving an upper layer reduced in the density of crystal defects such as misfit dislocation, and having excellent crystallinity.

The BP-based buffer layer mainly composed of an amorphous body in the as-grown state is particularly effective in relaxing the lattice mismatch between the electrically conducting single crystal material constituting the substrate and a constituent layer of the stacked layer structure. This is because the crystal layer mainly composed of an amorphous body is crystallized while absorbing the lattice distortion originated from the lattice mismatch and accompanying the film formation of the upper layer, thereby exerting an effect of giving a good quality upper layer. The BP-based buffer layer mainly composed of an amorphous body can be obtained, for example, by performing film formation at a temperature in excess of about 200° C., but not exceeding about 500° C., using a triethylboron $((C_2H_5)_3B)$/phosphine $(PH_3)$ reaction-system metal organic chemical vapor deposition (MOCVD) method, which is similarly used to form other constituent layers of the stacked layer structure, or by performing film formation at a temperature of about 150 to about 750° C. using a boron trichloride $(BCl_3)$/phosphorus trichloride $(PCl_3)$ reaction-system halogen vapor phase epitaxy (VPE) method. The film formation temperature is preferably from about 200 to about 500° C. (see, JP-A-2000-58451). Irrespective of the vapor phase growth means, the most important condition for obtaining a BP-based buffer layer mainly composed of an amorphous body is the film formation temperature. If the film formation temperature is less than about 200° C., the thermal decomposition of starting materials does not satisfactorily proceed and therefore, stable formation of the buffer layer cannot be attained. If the growth temperature exceeds 500° C., a polycrystalline layer is readily formed, and this is disadvantageous in that on the polycrystalline layer comprising randomly gathered single crystals, crystals readily grow in random azimuths by reflecting the orientation (coordinate direction) of each single crystal constituting the polycrystalline layer, and the upper layer obtained disadvantageously fails in having a flat surface. The difference in main constituent elements of the buffer layer can be determined by general analysis means such as X-ray diffraction analysis or electron-beam diffraction.

The buffer layer may also be composed of a low-temperature buffer layer comprising a BP-based material, which is formed at a relatively low temperature of 200 to 500° C., and a single crystal layer comprising a BP-based material, which is formed on the low-temperature buffer layer at a temperature higher than the film formation temperature of the low-temperature buffer layer. The BP-based crystal layer formed through the low-temperature buffer layer becomes a single crystal layer reduced in the density of crystal defects and having excellent crystallinity. The single crystal layer is effective in obtaining an upper layer reduced in the defect density. In other words, the buffer layer composed of a plurality of layers of a BP-based low-temperature buffer layer and a BP-based high-temperature single crystal layer formed on the low-temperature buffer layer is effective in obtaining an upper layer having excellent crystallinity. Examples of the buffer layer structure in this category include a stratified buffer layer composed of two layers of a low-temperature buffer layer comprising amorphous boron phosphide (BP) and a BP single crystal layer. The high-temperature buffer layer is preferably formed at a film formation temperature of approximately from 800 to 1,200° C. using vapor phase growth means, such as MOCVD method described above.

On the low-temperature buffer layer or on the stratified buffer layer, a light-emitting part is constructed. The light-emitting part is a portion undertaking the light emission and is composed of at least a light-emitting layer and a clad layer. The light-emitting part can be composed of either a single hetero structure or a double hetero junction structure. The light-emitting part is preferably composed of a double hetero (DH) junction structure so that high-intensity light emission can be obtained due to the carrier "confinement effect" compared to a single hetero junction structure. FIG. 3 shows an example of the light-emitting part 30 of a pn-junction DH structure according to the first embodiment, which is composed of a light-emitting layer 304 sandwiched by a lower clad layer 303 and an upper clad layer 305. The intensity of light emitted from the light-emitting part depends on the crystallinity of a functional layer constituting the light-emitting part, particularly a crystal layer as the light-emitting layer. In general, as the crystal layer used has higher quality reduced in dislocation or defect, the light emission obtained can have higher intensity. Accordingly, the light-emitting part is preferably composed of a crystal layer reduced in lattice mismatch with the above-described low-temperature buffer layer or stratified buffer layer. For example, cubic boron gallium phosphide $(B_{0.97}Ga_{0.03}P)$ having a gallium (Ga) compositional ratio of 0.03 (3%), a cubic gallium nitride phosphide $(GaN_{0.97}P_{0.03})$ having a phosphorus compositional ratio of 0.03 and a cubic gallium indium nitride $(Ga_{0.88}In_{0.12}N)$ having an indium compositional ratio of 0.12 have the same lattice constant of 4.566 Å. Therefore, on a $B_{0.97}Ga_{0.03}P$ buffer layer, a light-emitting part of a lattice-matched system can be formed using a $GaN_{0.97}P_{0.03}$) clad layer and a $Ga_{0.88}In_{0.12}N$ light-emitting layer. That is, the light-emitting part can be composed of a high-quality crystal layer reduced in the density of crystal defects attributable to the lattice mismatch.

The electrode on the surface side of the group-III nitride semiconductor 300 is constructed by disposing surface ohmic electrodes 308 on the surface of one constituent layer of the stacked layer structure 31, for example, the upper clad layer 305 constituting the light-emitting part 30 of a pn-junction DH structure, superposing thereon a window layer 306 comprising an electrically conducting transparent oxide crystal layer, such as ITO, to cover the surfaces of the upper clad layer 305 and the surface ohmic electrode 308 and to be conductive with the surface ohmic electrode 308, and providing a pad electrode 307 in the center part on the window layer 306. That is, the surface ohmic electrodes 308 are disposed on the surface of one constituent layer (the upper clad layer 305 in the LED 300 shown in FIG. 3) of a stacked layer structure 31 for use in a group-III nitride semiconductor LED 300, independently of the pad electrode 307, while preventing their direct contact with the pad electrode 307. The pad electrode 307 and the surface ohmic electrode 308 are conductive through the electrically conducting transparent oxide crystal layer, such as ITO, of the window layer 306. Other than ITO, the window layer 306 can also be similarly formed from a good conductor transparent material having a transmittance sufficiently high to allow the efficient ejection of emitted light to the outside, and, at the same time, having the capability of supplying a device operating current to the surface ohmic electrode 308. Examples of the constituent material other than ITO includes zinc oxide (ZnO) and a mixed oxide of zinc (Zn) and silicon (Si).

The electrode on the surface side of the LED 300 can be produced through a first step of forming a surface electrode 308 on the surface of the upper clad layer 305 using known means, such as photolithography, a second step of covering the surface of the upper clad layer 305 and the surface ohmic electrode 308 using sputtering or the like to form a window layer 306 comprising an electrically conducting transparent oxide crystal layer that is conductive with the surface ohmic electrode 308, and a third step of forming a pad electrode 307 for wire bonding in the center of the upper surface of the window layer 306 so that it is conductive with the window layer 306.

In this case, the pad electrode 307 is formed on the upper clad layer 305 via a window layer 306 comprising an electrically conducting transparent oxide crystal layer, whereby the electrically conducting transparent oxide crystal layer is not allowed to exist on the surface of the pad electrode 307 used for wire bonding. If an electrically conducting transparent oxide crystal layer is present on the pad electrode, the region having the electrically conducting transparent oxide crystal layer cannot be recognized since the layer is transparent, and wire bonding may be performed on the electrically conducting transparent oxide layer to cause a problem of failing to bond the wire to the pad electrode 307. This problem can be prevented without fail by forming the pad electrode 307 on the electrically conducting transparent oxide crystal layer so that the electrically conducting transparent oxide crystal layer does not exist on the surface of the pad electrode used for wire bonding.

Figure 4:
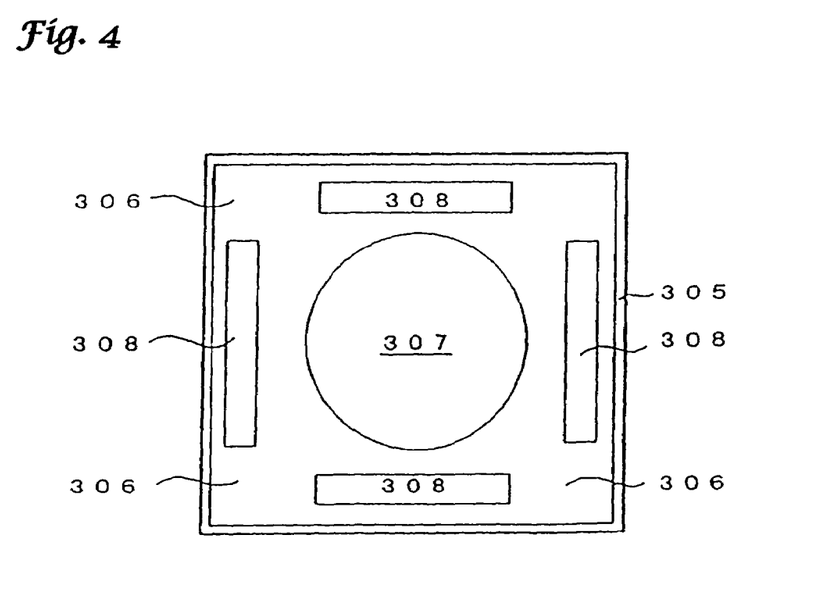
FIG. 4 is a schematic plan view of a group-III nitride semiconductor LED having a surface ohmic electrode according to the present invention.

In particular, the present invention is characterized in that a group-III nitride semiconductor LED is fabricated by disposing, when planarly viewed, surface ohmic electrodes 308 in the periphery of a pad electrode 307. FIG. 4 shows an example of the configuration of surface ohmic electrodes 308 according to the first embodiment. The surface ohmic electrodes 308 disposed on the surface of one constituent layer 305 (see, FIG. 3) of the stacked structure 31 (see, FIG. 3) at bilaterally symmetric positions with the pad electrode 307 centered has an effect of distributing and diffusing the device operating current into the inside of one constituent layer 305 and in turn into the light-emitting part 30 (see FIG. 3). Examples of the surface ohmic electrode constructed differently from the plurality of surface ohmic electrodes 308 shown in FIG. 4 include the case where the surface ohmic electrode is constructed by a single cyclic metal electrode. In the present invention, unlike the configuration means shown in conventional techniques (see, JP-A-57-111076) where ohmic electrodes are is landed in the intermediate region between pad electrodes, which are not provided in the center of the light-emitting device but in the periphery of the device, the surface ohmic electrode is disposed, when planarly viewed, in the periphery of the pad electrode provided in the center of the light-emitting device.

Referring to FIG. 3, the light emission in the projective region 307a of the pad electrode 307, which is present beneath the pad electrode 307, cannot be efficiently displayed to the outside because the light emitted from the light-emitting part 30 is shielded by the pad electrode 307. In other words, the device operating current supplied to the projective region 307a from the pad electrode 307 through the window layer 306 is wasted and fails in effectively contributing to the enhancement of the light emission intensity of the device.

Accordingly, in a second embodiment of the present invention, the surface ohmic electrodes 308 are disposed on the surface of the region 307b (hereinafter referred to as an "open light-emitting region 307b") other than the projective region 307a of the pad electrode 307 on the group-III nitride crystal layer constituting the stacked layer structure 31. FIG. 4 shows a schematic plan view of a group-III nitride semiconductor LED having surface ohmic electrodes of the present invention. The ohmic electrodes 308 disposed in the open light-emitting region 307b exert an effect of preferentially passing and diffusing the device operating current to the open light-emitting region 307b. When the device operating current is allowed to flow only to the open light-emitting region 307b, which is opened to the outside and therefore, facilitated in displaying the emitted light to the outside, the current density of the device operating current which in turn flows to, for example, the light-emitting part 30 having a gallium indium nitride ($Ga_YIn_{1-Y}N$, where $0 \leq Y \leq 1$) light-emitting layer 304, which is located below the open light-emitting region 307b, is increased, which is advantageous in obtaining a group-III nitride semiconductor LED having high-intensity light emission.

In a third embodiment of the present invention, the surface ohmic electrode is disposed on the surface of the open light-emitting region at bilaterally symmetric position with respect to the center of the pad electrode. The surface ohmic electrode disposed in the periphery of the pad electrode to have a positional relationship of bilateral symmetry exerts an effect of homogeneously diffusing the device operating current over a wide range of the light-emitting part. In particular, when the surface ohmic electrode is disposed on the surface of the open light-emitting region and, at the same time, in the bilaterally symmetric position with respect to the center of the pad electrode, the current density of the device operating current flowing to the open light-emitting region can be equalized, which is advantageous in obtaining a group-III nitride semiconductor LED having homogeneous (in-plane) emission intensity.

In a forth embodiment of the present invention, the surface ohmic electrodes are provided in the isometric positions from the center of the pad electrode on the surface of the open light-emitting region. The ohmic electrodes provided in the periphery of the pad electrode at equal intervals exert an effect of uniformly diffusing the device operating current over a wide range of the light-emitting part. In particular, the surface ohmic electrodes regularly disposed on the surface of the open light-emitting region at the same distance from the pad electrode provides an effect of equalizing the current density of the device operating current flowing to the open light-emitting region and homogenizing the light emission intensity in the open light-emitting region. The surface ohmic electrode configuration according to the fourth embodiment can be constructed, for example, by disposing surface ohmic electrodes at a plurality of positions on the circumference of a concentric circle centered in the planar center of the pad electrode. The surface ohmic electrodes provided in several positions are not all necessary to have the same planar shape but at least the surface ohmic electrodes located in the bilaterally symmetric positions with respect to the pad electrode preferably have the same planar shape so that the potential distribution can be made bilaterally symmetric in the open light-emitting region, thereby obtaining light emission having homogeneous intensity from the open light-emitting region.

In a fifth embodiment of the present invention, the surface ohmic electrode is composed of a plurality of electrodes disposed at equal intervals on the surface of one constituent layer of the stacked layer structure. By disposing a plurality of surface ohmic electrodes at equal intervals in the peripheral region of the pad electrode on the surface of one constituent layer, the device operating current supplied through the window layer from the pad electrode can be uniformly flowed to the light-emitting part. In particular, when the surface ohmic electrodes are provided at constant intervals on the surface of the open light-emitting region while preventing these from coming into contact with the projective region of the pad electrode, the device operating current in a high and uniform current density can preferentially flow almost exclusively to the open light-emitting region (that is, the region other than the projective region of the pad electrode) where the emitted light can be easily displayed to the outside. This is advantageous in obtaining a group-III nitride semiconductor LED having homogeneous (in-plane) emission intensity. The surface ohmic electrodes provided at equal intervals are not always necessary to have the same planar shape but the surface ohmic electrodes disposed at symmetric positions with respect to the pad electrode preferably have the same planar shape.

Figure 5:
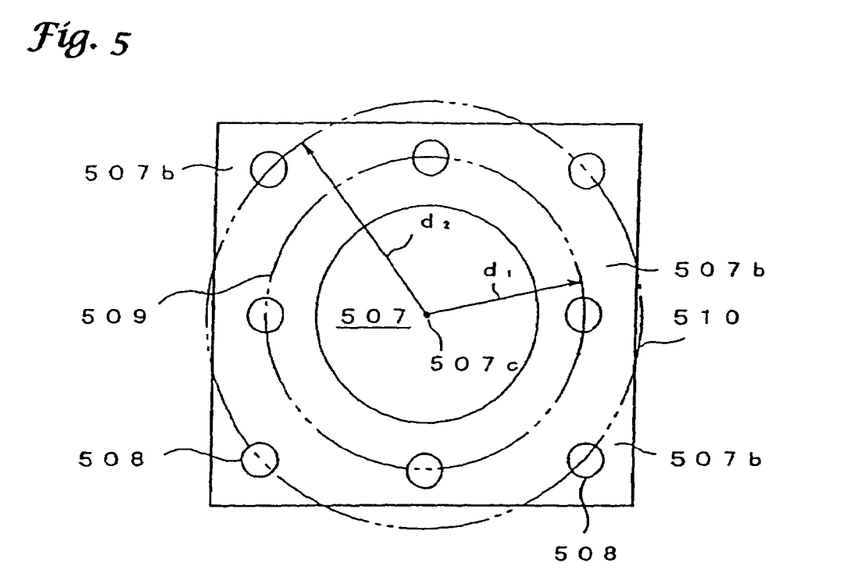
FIG. 5 is a schematic plan view of another group-III nitride semiconductor LED having a surface ohmic electrode according to the present invention.

In particular, surface ohmic electrodes disposed exclusively in the open light-emitting region by utilizing all construction means according to the third to fifth embodiments above provide the greatest effect in allowing the device operating current to preferentially flow to the open light-emitting region at a homogeneous current density. FIG. 5 is a schematic plan view showing one configuration form of surface ohmic electrodes 508, where the contents described in the third to fifth embodiments are generally included. Specifically, FIG. 5 is a schematic plan view of a group-III nitride semiconductor LED having electrodes constructed so that surface ohmic electrodes 508 are disposed in the open light-emitting region 507b (a) when planarly viewed, at bilaterally symmetric positions with respect to the pad electrode 507 in the peripheral region of the pad electrode 507 without coming into contact with the projective region of the pad electrode 507, (b) at several portions on the circumferences 509 and 510 of two concentric circles, which are located at the same distance from the center 507c of the pad electrode 507, having a radius $d_1$ or $d_2$ (provided that $d_2 > d_1$) and centered in the center of the pad electrode 507, and (c) at equal intervals from each other on the same circumference (509 or 510). By disposing the surface ohmic electrodes 508 as shown in FIG. 5 to equalize the current density of the device operating current flowing to the open light-emitting region 507b, the device operating current can be preferentially and homogeneously flowed to the open light-emitting region 507b. Therefore, the group-III nitride semiconductor LED obtained can be free of extinction in the limb of LED and favored with excellent homogeneity of the (in-plane) emission intensity.

If the contact area between the surface ohmic electrode and a constituent layer of the stacked layer structure is reduced, the injection density (current density) of the device operating current is increased and the light emission intensity may be elevated. However, if the contact area between the surface ohmic electrode and the constituent layer is reduced, the ohmic contact resistance increases to cause useless increase of the forward voltage (forward voltage: Vf), which is disadvantageous. Accordingly, in a sixth embodiment of the present invention, the ratio (=A/B) of the sum (=A) of areas of the surface ohmic electrodes to the total area (=B) of the open light-emitting region is specified to be from 5 to 30%. The term "total area (=B) of the open light-emitting region" as used herein means an area obtained by subtracting the bottom area of the pad electrode corresponding to the surface area in the projective region of the pad electrode from the surface area of one constituent layer where surface ohmic electrodes are disposed. The term "sum (=A) of areas of the surface ohmic electrodes" as used herein means, the planar area of the ohmic electrode in the case of a single ohmic electrode, and the sum of planar areas of respective ohmic electrodes in the case of a plurality of ohmic electrodes.

If the percentage of the sum (=A) of areas of surface ohmic electrodes occupying the total area (=B) of the open light-emitting region is less than 5%, the current density of the device operating current increases to bring about enhancement of the light emission intensity. However, an abrupt increase in the Vf disadvantageously occurs when the forward voltage is set to 20 mA. For example, compared with the group-III nitride semiconductor LED having a ratio within the above-described preferred range, the Vf increases by about 20 to 30% and sometimes elevates in excess of 4.5 V. As the area of the surface ohmic electrode occupying the open light-emitting region increases, the Vf decreases. However, the surface ohmic electrode is usually composed of a metal which absorbs light emitted from the light-emitting part and therefore, as the ratio (=A/B) elevates, the degree of absorption of the emitted light by the surface ohmic electrode comprising the metal increases. As a result, the light emission intensity disadvantageously undergoes a great reduction. If the percentage of the sum (=A) of areas of the surface ohmic electrodes occupying the total area (=B) of the open light-emitting region exceeds 30%, the light emission intensity of LED, for example, at a forward current of 20 mA may decrease to about 40 to 50% compared with a group-III nitride semiconductor LED having a ratio within the above-described preferred range.

For example, in the case of an LED where a circular pad electrode having a diameter of 120 $\mu$m is mounted and the surface of LED is in the form of a square having a one-side length of 350 $\mu$m, the total area of the open light-emitting region obtained by subtracting the projective region of the pad electrode from the planar surface area of LED is about $1.1 \times 10^{-3}$ cm$^2$. With this total area (=B) of the open light-emitting region, when the sum (=A) of areas of the surface ohmic electrodes is adjusted to from $5.5 \times 10^{-5}$ cm$^2$ (A/B=0.05) to $3.3 \times 10^{-4}$ cm$^2$ (A/B=0.30), the group-III nitride semiconductor LED fabricated can have high light emission intensity and low forward voltage at the same time. Furthermore, for example, when a total of 12 pieces of circular surface ohmic electrodes having a diameter of 20 $\mu$m are disposed in the open light-emitting region having a total area of about $1.1 \times 10^{-3}$ cm$^2$ (=B), the sum (=A) of areas of the surface ohmic electrodes is $9.4 \times 10^{-6}$ cm$^2$ and a group-III nitride semiconductor LED having a ratio (A/B) of about 8.6% can be fabricated. This ratio (A/B) is usually adjusted by appropriately designing the diameter, width or length of the surface ohmic electrode. In particular, when the ratio is adjusted to from about 7% to about 10%, the fabricated group-III nitride semiconductor LED can advantageously maintain high light emission intensity and can have low Vf. When the surface ohmic electrode is provided on the surface of p-type group-III nitride semiconductor layer, the ratio (=A/B) is preferably set larger than when of disposing the surface ohmic electrode on the surface of n-type group-III nitride semiconductor layer to equalize the current density of the device operating current flowing to the open light-emitting region. This is because the p-type group-III nitride semiconductor is small in carrier mobility and narrow in the range where the device operating current can diffuse compared with the n-type group-III nitride semiconductor. Therefore, the contact area of the surface ohmic electrode with the semiconductor layer must be enlarged to broaden the range where the current diffuses. Particularly, in the case of a p side-up type LED where the surface ohmic electrode is provided on the surface of a p-type group-III nitride semiconductor layer, the ratio (A/B) is preferably set to about 10% larger than the ratio (A/B) as recognized as suitable in an n side-up type LED, thereby obtaining good results.

The useless increase of the forward voltage can be inhibited by reducing the contact resistance of surface ohmic electrode, which is dependent on the construction material of one constituent layer (contact layer) where the surface ohmic electrode is provided. Accordingly, in a seventh embodiment of the present invention, the constituent layer of the stacked layer structure, on which the surface ohmic electrode is disposed, is composed of a gallium nitride phosphide ($GaN_{1-X}P_X$, where $0<X<1$) crystal layer. Conventionally, gallium nitride (GaN) has been used for the contact layer in many cases (see, JP-A-6-268259). However, when $GaN_{1-X}P_X$ ($0<X<1$) is used, the band gap can be varied by adjusting the phosphorus compositional ratio (=X) (see, *Appl. Phys. Lett.*, Vol. 60, No. 20, pp. 2540–2542 (1992)). In other wards, depending on the phosphorus compositional ratio (=X), the contact layer can be formed from a group-III nitride semiconductor material having a smaller band gap than gallium nitride (GaN) and therefore, a surface ohmic electrode having a small contact resistance can be advantageously formed.

For example, the transition energy corresponding to blue light emission at a wavelength of 450 nm (nanometer) is about 2.75 eV and the transition energy corresponding to green light emission at a wavelength of 520 nm is about 2.38 eV. Accordingly, when $GaN_{1-X}P_X$ ($0<X<1$) used for the contact layer has a band gap of about 2.8 eV or more in a LED having a light-emitting layer of giving blue light emission, or a band gap of about 2.4 eV or more in a LED having a light-emitting layer of giving green light emission, the contact layer constructed can be suppressed from absorbing the emitted light. In view of the non-linear change of gallium nitride phosphide ($GaN_{1-X}P_X$, where $0<X<1$) (see, *Appl. Phys. Lett.*, Vol. 60, supra), a contact layer having excellent transmission for blue or green light emission can be composed of $GaN_{1-X}P_X$ ($0<X\leq0.05$) having a phosphorus compositional ratio (=X) of 5% (X=0.05) or less. $GaN_{1-X}P_X$ ($0<X\leq0.05$) having a phosphorus compositional ratio (=X) of 5% (X=0.05) or less has a band gap in excess of 2.8 eV at room temperature, and, to be advantageously, $GaN_{1-X}P_X$ can also be used as a clad layer for sandwiching a light-emitting layer of giving blue or green light emission or as a contact layer serving also as the clad layer.

The surface ohmic electrode provided on the surface of the contact layer comprising a gallium nitride (GaN)-based group-III nitride crystal layer can be composed of, in a n-type contact layer, gold (Au) or a gold alloy such as gold.germanium (Au.Ge) and gold.tin (Au.Sn). In a p-type contact layer, the surface ohmic electrode can be composed of a zinc (Zn)-containing alloy such as indium.zinc (In.Zn) and gold.zinc (Au.Zn), or a gold.beryllium (Au.Be) alloy. These metals form good ohmic contact with the gallium nitride (GaN)-based group-III nitride crystal layer. Particularly, when the contact layer comprises $GaN_{1-X}P_X$, these metals can form good ohmic contact by having low contact resistance. For the pad electrode, a metal having a small electric resistance, such as gold (Au) and aluminum (Al), is preferably used.

The surface ohmic electrode disposed in the periphery of the pad electrode on the surface of the group-III nitride semiconductor crystal layer of the present invention can provide an effect of allowing the device operating current supplied through a window layer from the pad electrode on the window layer to diffuse over a wide range of the light-emitting layer.

The surface ohmic electrode disposed in the region (open light-emitting region) other than the projective region of the pad electrode on the surface of the group-III nitride semiconductor crystal layer can provide an effect of allowing the device operating current to preferentially flow to the open light-emitting region where the emitted light can be easily displayed outside.

The surface ohmic electrode disposed at the bilaterally symmetric position with respect to the center of the pad electrode on the surface of the open light-emitting region can provide an effect of allowing the device operating current to preferentially and homogeneously diffuse in the open light-emitting region.

The surface ohmic electrodes disposed at isometric positions from the center of the pad electrode on the surface of the open light-emitting region can provide an effect of allowing the device operating current to more homogeneously flow to the open light-emitting region.

The surface ohmic electrode composed of a plurality of electrodes disposed at equal intervals from each other can provide an effect of equalizing the current density of the device operating current flowing to the open light-emitting region.

The surface ohmic electrodes controlled so that the sum of their areas is from 5 to 30% of the total area of the open light-emitting region can provide an effect of elevating the light emission intensity without causing useless increase of the forward voltage.

The gallium nitride phosphide ($GaN_{1-X}P_X$, where $0<X<1$) crystal layer used for the contact layer of the surface ohmic electrode can provide an effect of giving a surface ohmic electrode having a small contact resistance.

EXAMPLES

Unless indicated otherwise herein, all parts, percents, ratios and the like are by weight.

The group-III nitride semiconductor light-emitting diode and the electrode therefor according to the present invention are described in greater detail below by referring to the Examples, which should not be constituted as limiting the scope of the present invention.

Example 1

Figure 6:
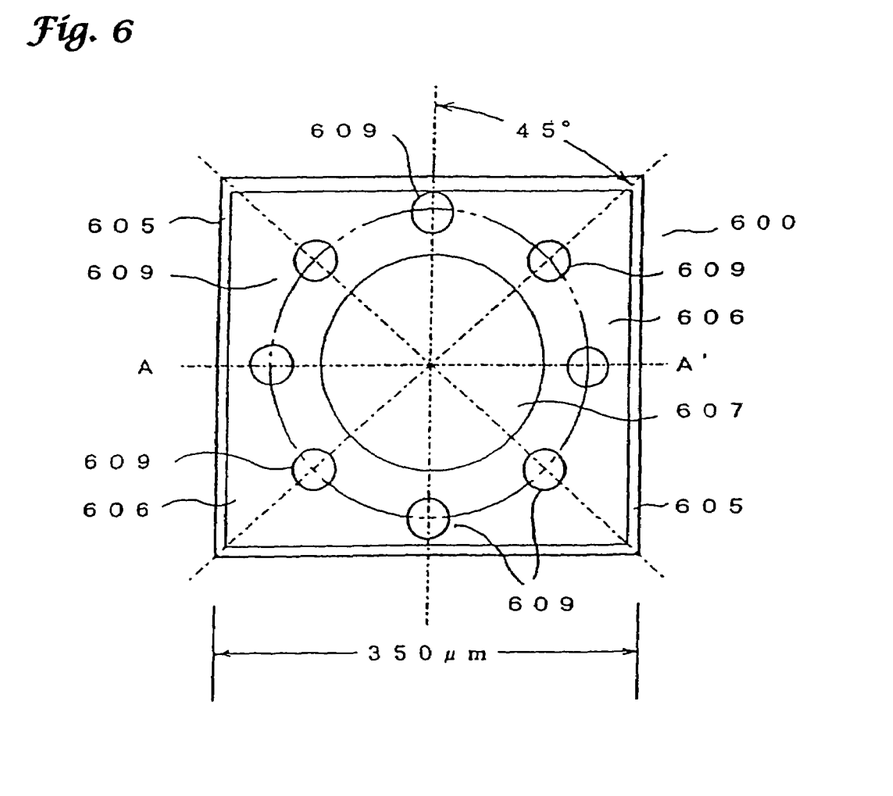
FIG. 6 is a schematic plan view of a group-III nitride semiconductor LED according to Example 1 of the present invention.
Figure 7:
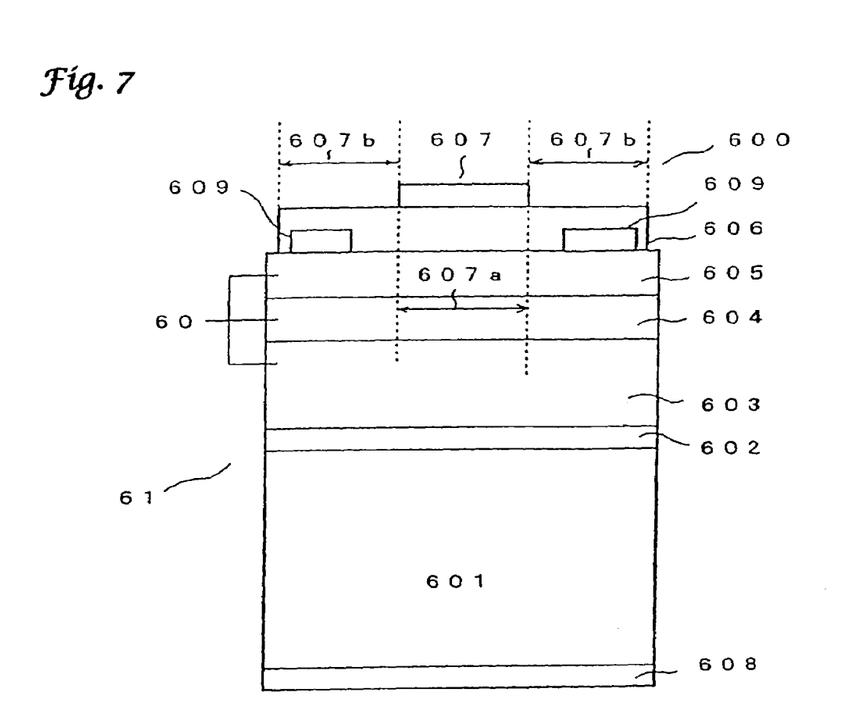
FIG. 7 is a schematic sectional view cut along the broken line A–A' of the LED shown in FIG. 6.

FIG. 6 is a schematic plan view of a group-III nitride semiconductor LED 600 of Example 1. FIG. 7 is a schematic sectional view cut along the broken line A–A' of LED 600 shown in FIG. 6.

LED 600 was fabricated based on a stacked layer structure 61 comprising a substrate 601 having provided thereon the following layers 602 to 605:

(1) a substrate 601 composed of a boron (B)-doped Si single crystal having a p-type conductive (100) face, (2) a low-temperature buffer layer 602 comprising a Zn-doped p-type boron phosphide (BP) and having a layer thickness of about 20 nanometer (nm), which was grown at 350° C. by a normal pressure (atmospheric pressure) MOCVD method in a reaction system of triethylborane (($C_2H_5)_3B$)/phosphine ($PH_3$)/hydrogen ($H_2$) while setting the feed ratio (V/III ratio) between $PH_3$ and ($C_2H_5)_3B$ to about 300, (3) a Zn-doped p-type boron phosphide (BP) single crystal layer 603 having a layer thickness of about 0.8 μm and a carrier concentration of about $1\times10^{18}$ $cm^{-3}$, which was stacked on the p-type BP low-temperature buffer layer 602 at about 1,000° C. by an atmospheric pressure MOCVD method in a reaction system of trimethyl gallium ((CH$_3$)$_3$Ga)/ammonia (NH$_3$)/PH$_3$/H$_2$ using dimethylzinc ((CH$_3$)$_2$Zn) as a starting material for the Zn doping, (4) a light-emitting layer 604 comprising an n-type gallium indium nitride mixed crystal (Ga$_{0.94}$In$_{0.06}$N) and having a layer thickness of about 8 nm, which was grown at 880° C. by an atmospheric pressure MOCVD method in a reaction system of (CH$_3$)$_3$Ga/trimethyl indium ((CH$_3$)$_3$In)/NH$_3$/H$_2$ to have a multi-phase structure consisting of a plurality of phases different in the indium composition with the average indium (In) compositional ratio being about 0.06 (6%), and (5) an n-type gallium nitride (GaN) layer 605 having a layer thickness of about 0.1 μm and a carrier concentration of about 2×10$^{18}$ cm$^{-3}$, which was grown at 1,080° C. by an atmospheric pressure MOCVD method in a reaction system of (CH$_3$)$_3$Ga/NH$_3$/H$_2$.

The light-emitting part 60 having a pn junction-type double hetero (DH) junction structure was constructed using the p-type BP single crystal layer 603 stacked on the low-temperature buffer layer 602 as a lower clad layer, the Ga$_{0.94}$In$_{0.06}$N layer 604 as a light-emitting layer and the n-type GaN layer 605 as an upper clad layer. In the open light-emitting region 607b other than the projective region 607a of the pad electrode 607 on the surface of the upper clad layer 605, n-type surface ohmic electrodes 609 comprising gold (Au) were distributed and disposed. The n-type surface ohmic electrodes 609 were formed by a method of once covering the entire surface of the upper clad layer 605 with a gold (Au) film by vacuum deposition and then allowing the Au deposited film to remain only in the desired regions through patterning using a conventional photolithography technique. The Au deposited film adhering to the region other than the desired regions was removed by a wet etching solution. Thereafter, on the surface of the upper clad layer 605, while allowing the n-type surface ohmic electrodes 609 to remain thereon, a window layer 606 comprising an indium.tin composite oxide (ITO) was deposited by an ordinary high-frequency sputtering method. The ITO film constituting the window layer 606 had a resistivity of about 6×10$^{-4}$ ohm·centimeter (Ω·cm) and a layer thickness of about 550 nanometer (nm).

In addition to the surface ohmic electrodes 609, the following electrodes were formed on the stacked layer structure 61 using a conventional photolithography technique or the like, thereby fabricating the LED 600:

(1) a circular pad electrode 607 comprising gold (Au) and having a diameter of 120 μm, which was formed in the center part of the window layer 606, and (2) a p-type back surface ohmic electrode 608 comprising aluminum (Al), which was formed almost throughout the entire back surface of the Si single crystal substrate 601.

The n-type surface ohmic electrode 609 was composed of metal electrodes comprising Au and having a diameter of 30 μm and the same circular shape, which were disposed at 8 positions in total on the surface of the open light-emitting region 607b. The sum (=A) of areas of the n-type surface ohmic electrodes 609 was about 5.6×10$^{-5}$ cm$^2$. The surface ohmic electrodes 609 were distributed and disposed at positions on a circumference having a radius of 120 μm and centered in the center of the pad electrode 607 to lie apart from each other at equal intervals of about 46 μm in terms of the rectilinear distance by taking a center angle of 45° C.

Thereafter, the stacked layer structure 60 having formed thereon electrodes 607 to 609 was divided into individual chips 600 by general scribing means utilizing the cleavage property in the [110] direction of the Si single crystal substrate 601. The planar shape of the chip 600 was a square having a one-side length of about 350 μm, the diameter of the pad electrode 607 was 120 μm as described above and the area (=B) of the open light-emitting region 607b was about 1.1×10$^{-3}$ cm$^2$. Accordingly, the ratio (=A/B) of the sum of areas of the surface ohmic electrodes occupying in the total area of the open light-emitting region 607b was about 5.1%.

An operating current was passed between the surface ohmic electrodes 609 and the back surface ohmic electrode 608 through the pad electrode 607 and the window layer 606, and as a result, the following light emission properties were obtained.

(a) Light emission wavelength: 440 nm (b) Light emission luminance: 1.6 candela (cd) (provided that forward current=20 mA)

(c) Forward voltage: 3.8 Volt (V) (provided that forward current=20 mA)

(d) Backward voltage: 20 V or more (provided that reverse current=10 μA)

By constructing the surface ohmic electrode as in this Example, the device operating current was preferentially flowed to the open light-emitting region and therefore, a group-III nitride semiconductor light-emitting device having high emission intensity was provided.

Example 2

Figure 8:
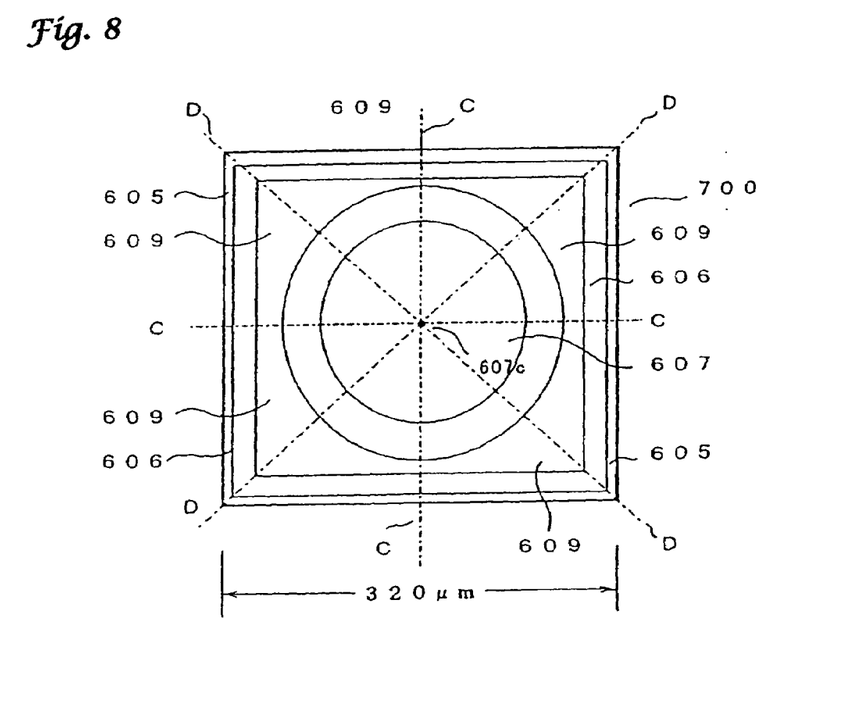
FIG. 8 is a schematic plan view of a group-III nitride semiconductor LED according to Example 2 of the present invention.

In Example 2, the present invention is described by referring to a group-III nitride semiconductor light-emitting diode 700 different in the configuration of surface ohmic electrodes 609 from Example 1 and manufactured using the same stacked layer structure 61 as in Example 1.

FIG. 8 shows a schematic plan view of a group-III nitride semiconductor LED 700 according to Example 2. In FIG. 8, the same portions as those shown in FIG. 6 are indicated by the same reference numbers as in FIG. 6 and not described here.

In the group-III nitride semiconductor LED 700 of Example 2, a frame-shaped surface ohmic electrode 609 having a stratified structure consisting of a gold (Au) lower layer and a nickel oxide (NiO$_x$, where X is about 1) upper layer was provided on the open light-emitting region 607b in the periphery of the pad electrode 607. The outer circumference of the frame-shaped surface ohmic electrode 609 had a square form by reflecting the outer shape of the square LED 700 having a one-side length of 320 μm and the inner circumference had a circular shape analogous to the circular pad electrode 607 having a diameter of 120 μm. The distance from the center 607c of the pad electrode 607 to the outer circumference of the frame-shaped surface ohmic electrode 609 was 120 μm and the distance to the circular inner circumference was 100 μm in terms of the radius from the center 607c. The surface ohmic electrode 609, which has a planar shape as if resulting from punching out a circular region in a diameter of 200 μm from the center part of the square having a one-side length of 240 μm, was disposed to come bilaterally symmetric with respect to either the center line C or the diagonal line D, each passing through the center 607c of the pad electrode 607. The ratio (=A/B) of area of the surface ohmic electrode 609 occupying the total area of the open light-emitting region 607b was 28.8%.

After forming the surface ohmic electrode 609 using conventional means, such as vacuum deposition and photolithography, the same ITO film as in Example 1 was deposited as the window layer 606 by a general high-frequency sputtering method. In the center of the window layer 606, a pad electrode 607 comprising gold (Au) was provided. On the back surface of the Si single crystal substrate 601, a back surface ohmic electrode 608 comprising aluminum (Al) was formed and thereafter, an LED 700 was obtained through the separation by scribing using cleavage.

An operating current was passed between the pad electrode 607 and the back surface ohmic electrode 608 of the LED 700, and as a result, the following properties were obtained.

(a) Light emission wavelength: 440 nm (b) Light emission luminance: 1.4 candela (cd) (provided that forward current=20 mA)

(c) Forward voltage: 3.6 Volt (V) (provided that forward current=20 mA)

(d) Backward voltage: 20 V or more (provided that reverse current=10 μA)

As such, in Example 2, a group-III nitride semiconductor light-emitting diode having a low forward voltage and a high light emission intensity was obtained. Furthermore, from the near field pattern obtained for verifying the homogeneity in the relative intensity of the light emission in the open light-emitting region, the light emission intensity was homogeneous almost throughout the surface of the open light-emitting region. This reveals that when the surface ohmic electrode is composed of an electrode distributed to the open light-emitting region, the device operating current can be homogeneously flowed almost throughout the open light-emitting region.

Figure 10:
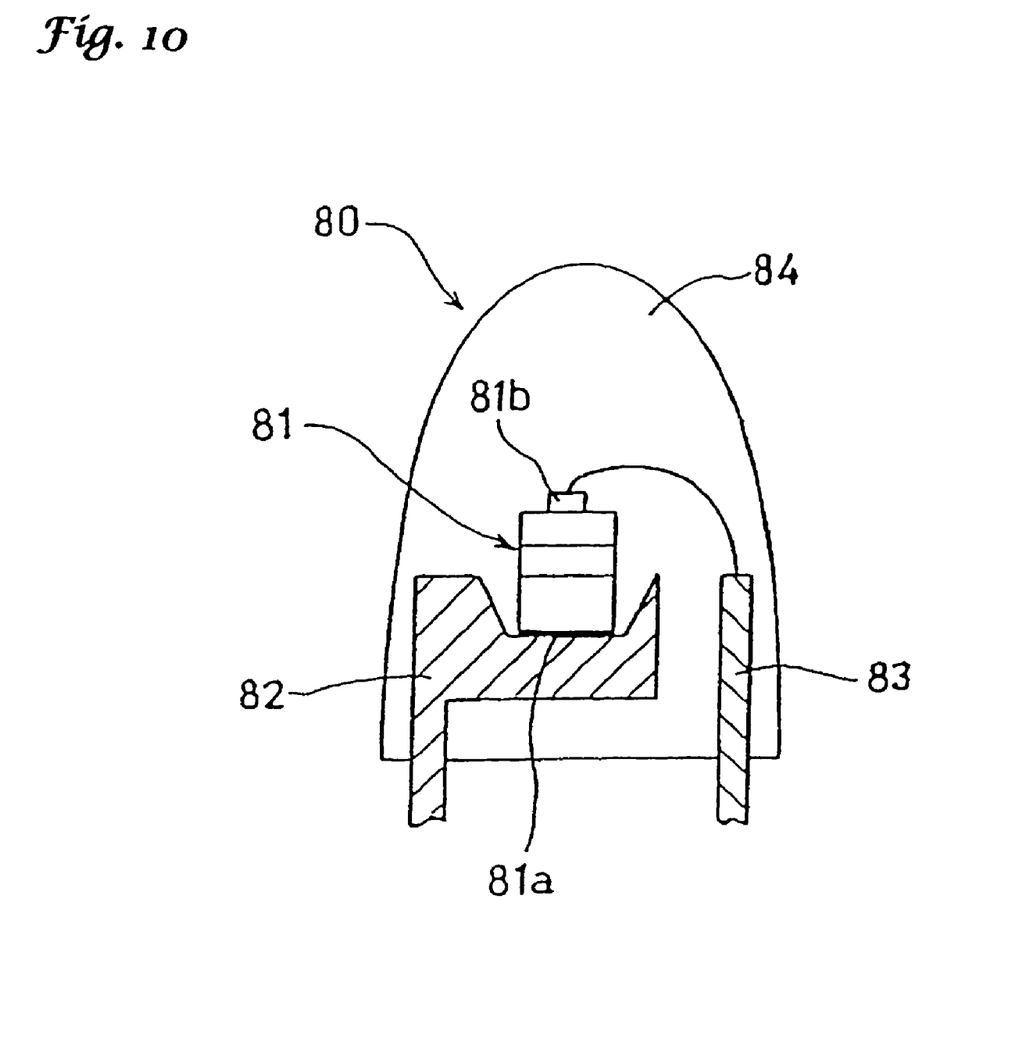
FIG. 10 is a view showing the structure of the light-emitting diode lamp of the present invention.

A light-emitting diode (LED) lamp manufactured using this group-III nitride semiconductor LED 700 is described below. FIG. 10 is a view showing the structure of a LED lamp manufactured using the LED obtained above. In FIG. 10, the LED lamp 80 comprises a light-emitting diode 81, a mount lead 82 and an inner lead 83, and the whole is molded with a transparent resin 84.

The light-emitting diode 81 used was the group-III nitride semiconductor LED 700 manufactured in Example 2. The electrode 81a (back surface ohmic electrode 608 of LED 700) formed on the back surface of the substrate of the light-emitting diode 81 was fixed on the mount lead 82 to electrically contact with the mount lead 82 and the pad electrode 81b (pad electrode 607 of LED 700) of the light-emitting diode 81 was bonded to the inner lead 83 by wire bonding.

This LED lamp 80 used the group-III nitride semiconductor light-emitting diode of the present invention and therefore, was improved in light emission efficiency compared with those using a conventional LED.

This LED lamp 80 can be used as a lighting fixture for vehicles, a lighting fixture for railway vehicles, a traffic signal light, a crossing signal light, a side back indicator light, a sight line guidance light, a light source for a monitor display or console panel display or a light source for office equipment, such as copying machine and facsimile, or for an information panel used outdoors. In this case, the light source using the LED lamp 80 ensures high light emission efficiency compared with conventional ones.

Example 3

Figure 9:
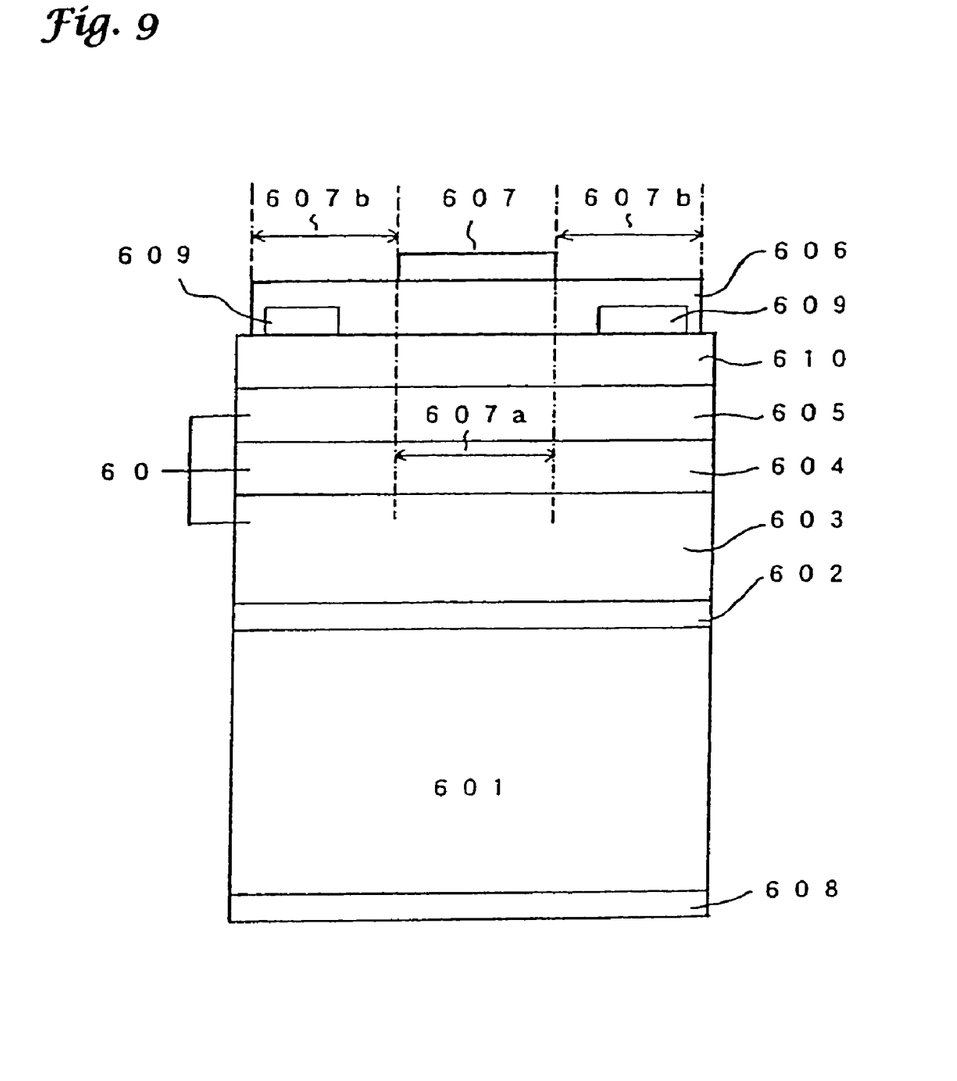
FIG. 9 is a schematic sectional view of a group-III nitride semiconductor LED according to Example 3 of the present invention.

In Example 3, a group-III nitride semiconductor LED was fabricated using a stacked layer structure obtained by stacking gallium nitride phosphide ($GaN_{1-X}P_X$, where X=0.03) which becomes an ohmic contact layer 610, on the n-type gallium nitride (GaN) layer 605 constituting the uppermost layer of the stacked layer structure described in Example 1. FIG. 9 shows a schematic sectional view of the group-III nitride semiconductor LED according to Example 3. In FIG. 9, the same constituent elements as those shown in FIG. 7 are indicated by the same reference numbers and not described here.

The n-type gallium nitride phosphide ($GaN_{0.97}P_{0.03}$) having a phosphorus compositional ratio of 3% and constituting the ohmic contact layer 610 was grown at 980° C. by a reduced-pressure MOCVD method in a reaction system of trimethylgallium (($CH_3)_3Ga$)/ammonia ($NH_3$)/phosphine ($PH_3$)/hydrogen ($H_2$). The carrier concentration of the ohmic contact layer 610 was adjusted to about $2\times10^{18}$ cm$^{-3}$ using disilane ($Si_2H_6$) as the n-type doping gas. The layer thickness of the ohmic contact layer 610 was about 0.15 μm.

In the open light-emitting region 607b on the surface of the n-type $G_{0.97}P_{0.03}$ ohmic contact layer 610, a surface ohmic electrode 609 comprising gold (Au) and having the same outer shape and the same bottom area as in Example 2 was formed. Thereafter, the surface ohmic electrode 609 was coated with an ITO film constituting the window layer 606 in the same manner as in Example 2 and in the center part of the ITO window layer, a circular pad electrode 607 consisting of a chromium (Cr) lower layer and a gold (Au) upper layer and having a diameter of 120 μm was provided. Furthermore, almost throughout the entire back surface of the p-type Si single crystal substrate 601, a back surface ohmic electrode 608 comprising aluminum (Al) was provided, thereby fabricating a group-III nitride semiconductor LED.

The group-III nitride semiconductor LED of Example 3 fabricated by providing a surface ohmic electrode 609 in the open light-emitting region 607 on the surface of the n-type $GaN_{0.97}P_{0.03}$ ohmic contact layer 610 had main properties shown below.

(a) Light emission wavelength: 440 nm (b) Light emission luminance: 1.3 candela (cd) (provided that forward current =20 mA)

(c) Forward voltage: 3.2 Volt (V) (provided that forward current=20 mA)

(d) Backward voltage: 20 V or more (provided that reverse current=10 μA)

The group-III nitride semiconductor LED obtained in Example 3 failed in providing a clear difference in the light emission wavelength and the backward voltage from the group-III nitride semiconductor LED obtained in Example 2. However, since the $GaN_{0.97}P_{0.03}$ layer was used as the ohmic contact layer, an effect of exhibiting high emission intensity and low forward voltage at the same time was provided.

According to the present invention, a device operating current can be homogeneously flowed to the light-emitting part, which has an effect of providing a group-III nitride semiconductor LED having high light emission intensity.

Particularly, in the present invention, when the surface ohmic electrode is disposed on the surface of the open light-emitting region other than the projective region of the pad electrode and a specific construction is employed, for example, (1) the surface ohmic electrode is disposed at a bilaterally symmetric position with respect to the center of the pad electrode, (2) the surface ohmic electrodes are disposed at isometric positions from the center of the pad electrode or (3) the surface ohmic electrodes are disposed at equal intervals from each other, the device operating current can be preferentially and homogeneously flowed to the open light-emitting region and the current density of the device operating current capable of flowing to the open light-emitting region can be increased. As a result, a group-III nitride semiconductor LED having high light emission intensity can be effectively obtained.

In addition, in the present invention, when the sum of areas of surface ohmic electrodes provided in the open light-emitting region is controlled to be from 5 to 30% of the total surface area of the open light-emitting region, an effect of giving a group-III nitride semiconductor LED having low forward voltage while keeping high light emission intensity.

Also, in the present invention, when the surface ohmic electrode is provided on the surface of a gallium nitride phosphide ($GaN_{1-x}P_x$, where $0<X<1$) crystal layer, a group-III nitride semiconductor LED more reduced in the forward voltage can be provided.

The electrode for group-III nitride semiconductor light-emitting diodes which is used for the above-described group-III nitride semiconductor light-emitting diode of the present invention, can give an LED having high light emission intensity. Furthermore, the method for producing the electrode for group-III nitride semiconductor light-emitting diodes of the present invention can produce an electrode for use in the manufacture of a group-III nitride semiconductor LED having high light emission intensity in a high yield. Particularly, when a pad electrode is formed on an electrically conducting transparent oxide crystal layer so that the electrically conducting transparent oxide crystal layer does not exist on the surface used for wire bonding of the pad electrode, problems of performing wire bonding on the electrically conducting transparent oxide layer and failing in bonding the wire to the pad electrode 307 can be prevented without fail.

While the invention has been described in detail and with reference to specific embodiments thereof, it will be apparent to one skilled in the art that various changes and modifications can be made therein without departing from the spirit and scope thereof.

What is claimed is:

1. A group-III nitride semiconductor light-emitting diode comprising at least a first conduction-type single crystal substrate provided with a first conduction-type back-surface ohmic electrode on a back surface thereof, a buffer layer comprising a boron phosphide (BP)-based material on a front surface of said single crystal substrate, a gallium nitride (GaN)-based group-III nitride crystal layer having a light-emitting part of hetero-junction structure on said buffer layer, and a window layer comprising an electrically conducting transparent oxide crystal layer on said group-III nitride crystal layer, wherein said group group-III nitride crystal layer comprises a light-emitting layer and a clad layer, at least a second conduction-type surface ohmic electrode conductive with said window layer is between a surface of said group-III nitride clad layer and said window layer and comes into contact with the surface of said group-III nitride clad layer, a pad electrode for wire bonding is disposed on the center of the upper surface of said window layer, said second conduction-type surface ohmic electrode is composed of a plurality of electrodes which are disposed on a surface of a region other than the projective region of the pad electrode on said group-III nitride crystal layer, and said window layer covers and is in contact with the surface of said group-III nitride clad layer on the entire projective region of the pad electrode.

2. The group-III nitride semiconductor light-emitting diode as claimed in claim 1, wherein said second conduction-type surface ohmic electrodes are disposed in a periphery of said pad electrode.

3. The group-III nitride semiconductor light-emitting diode as claimed in claim 1 or 2, wherein said second conduction-type surface ohmic electrodes are disposed at a bilaterally symmetric position with respect to the center of said pad electrode.

4. The group-III nitride semiconductor light-emitting diode as claimed in claim 1 or 2, wherein said second conduction-type surface ohmic electrodes are disposed at isometric positions from the center of said pad electrode.

5. The group-III nitride semiconductor light-emitting diode as claimed in claim 1 or 2, wherein said second conduction-type surface ohmic electrodes are composed of a plurality of electrodes disposed at equal intervals.

6. The group-III nitride semiconductor light-emitting diode as claimed in claim 1 or 2, wherein said second conduction-type surface ohmic electrodes are disposed in an open light-emitting region other than a projective region of the pad electrode on the surface of said group-III nitride crystal layer.

7. The group-III nitride semiconductor light-emitting diode as claimed in claim 6, wherein a sum of areas of second conduction-type surface ohmic electrodes is from 5 to 30% of a total area of the open light-emitting region.

8. The group-III nitride semiconductor light-emitting diode as claimed in claim 1 or 2, wherein the group-III nitride clad layer in contact with said second conduction-type surface ohmic electrode comprises gallium phosphide nitride represented by $GaN_{1-x}P_x$ wherein $0<X<1$.

9. A light-emitting diode lamp comprising the group-III nitride semiconductor light-emitting diode claimed in claim 1 or 2, a mount lead and an inner lead.

10. A light source comprising the light-emitting diode lamp claimed in claim 9.

11. An electrode for group-III nitride semiconductor light-emitting diodes for a group-III nitride semiconductor light-emitting diode comprising at least a gallium nitride (GaN)-based group-III nitride crystal layer having a light-emitting part of a hetero-junction structure, and a window layer comprising an electrically conducting transparent oxide crystal layer provided on said group-III nitride crystal layer, wherein said group-III nitride crystal layer comprises a light-emitting layer and a clad layer, and at least a surface ohmic electrode conductive with said window layer is between a surface of said group-III nitride clad layer and said window layer and comes into contact with the surface of said group-III nitride clad layer, a pad electrode for wire bonding is disposed on the center of the upper surface of said window layer, said surface ohmic electrode is composed of a plurality of electrodes which are disposed on a surface of a region other than the projective region of the pad electrode on said group-III nitride crystal layer, and said window layer covers and is in contact with the surface of said group-III nitride clad layer on the entire projective region of the pad electrode.

12. The electrode for group-III nitride semiconductor light-emitting diodes as claimed in claim 11, wherein said surface ohmic electrodes are disposed at a position in a periphery of said pad electrode.

13. The electrode for group-III nitride semiconductor light-emitting diodes as claimed in claim 11 or 12, wherein said surface ohmic electrodes are disposed at a bilaterally symmetric position with respect to the center of said pad electrode.

14. The electrode for group-III nitride semiconductor light-emitting diodes as claimed in claim 11 or 12, wherein surface ohmic electrodes are disposed at isometric positions from the center of said pad electrode.

15. The electrode for group-III nitride semiconductor light-emitting diodes as claimed in claim 11 or 12, wherein said surface ohmic electrodes are composed of a plurality of electrodes disposed at equal intervals.

16. The electrode for group-III nitride semiconductor light-emitting diodes as claimed in claim 11 or 12, wherein said surface ohmic electrodes are disposed in an open light-emitting region other than a projective region of the pad electrode on the surface of said group-III nitride crystal layer.

17. The electrode for group-III nitride semiconductor light-emitting diodes as claimed in claim 16, wherein a sum of areas of said surface ohmic electrodes is from 5 to 30% of a total area of the open light-emitting region.

18. The electrode for group-III nitride semiconductor light-emitting diodes as claimed in claim 11 or 12, wherein the group-III nitride clad layer in contact with said surface ohmic electrodes comprises gallium phosphide nitride represented by $GaN_{1-x}P_x$ wherein $0<X<1$.

19. A method for producing an electrode for group-III nitride semiconductor light-emitting diodes, comprising forming a plurality of surface ohmic electrodes in contact with a surface of a gallium nitride (GaN)-based group-III nitride crystal layer having a light-emitting part of hetero-junction structure, then covering the surface of said group-III nitride crystal layer and said surface ohmic electrodes to form a window layer comprising an electrically conducting transparent oxide crystal layer conductive with said surface ohmic electrodes, wherein said group-III nitride crystal layer comprises a light-emitting layer and a clad layer, and then forming a pad electrode for wire bonding on a center of the upper surface of said window layer conductive with said window layer, wherein said surface ohmic electrodes are disposed on a surface of a region other than the projective region of the pad electrode on said group-III nitride clad layer, and said window layer covers and is in contact with the surface of said group-III nitride clad layer on the entire projective region of the pad electrode.

20. The method for producing an electrode for group-III nitride semiconductor light-emitting diodes as claimed in claim 19, wherein the pad electrode is formed on the group-III nitride clad layer through a window layer comprising an electrically conducting transparent oxide crystal layer so that the electrically conducting transparent oxide crystal layer is not present on the surface of the pad electrode used for wire bonding.

* * * * *